United States Patent
Han

(10) Patent No.: US 6,207,562 B1
(45) Date of Patent: Mar. 27, 2001

(54) METHOD OF FORMING TITANIUM SILICIDE

(75) Inventor: Jae-Won Han, Bucheon (KR)

(73) Assignees: Anam Semiconductor Inc., Seoul (KR); Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/199,041

(22) Filed: Nov. 24, 1998

(30) Foreign Application Priority Data

Nov. 24, 1997 (KR) .................................................. 97-62316

(51) Int. Cl.[7] .................................................. H01L 21/44
(52) U.S. Cl. ........................... 438/664; 438/783; 438/714
(58) Field of Search .................................... 438/584, 587, 438/592, 595, 622, 649, 651, 656–657, 664, 653, 660, 783, 778, 471

(56) References Cited

U.S. PATENT DOCUMENTS

| | | | |
|---|---|---|---|
| 4,213,840 | * 7/1980 | Omori et al. | 204/192 |
| 5,482,739 | * 1/1996 | Hey et al. | 427/255.2 |
| 5,953,605 | * 9/1999 | Kodama | 438/231 |
| 5,972,785 | * 10/1999 | Shishiguchi | 438/592 |
| 5,985,756 | * 11/1999 | Shinmura | 438/648 |
| 5,990,021 | * 11/1999 | Prall et al. | 438/745 |
| 6,001,718 | * 12/1999 | Katata et al. | 438/592 |
| 6,007,624 | * 12/1999 | Wise | 117/96 |
| 6,010,929 | * 1/2000 | Chapman | 438/226 |

OTHER PUBLICATIONS

C. Y. Chang and S. M. Sze, ULSI Technology, 1996, McGraw–Hill Companies, 209–210 and 379–386.*
Stanley Wolf and Richard N. Tauber, Silicon Processing for the VLSI Era vol. 1: Process Technology, 1986, Lattice Press, pg 357–359.*

* cited by examiner

*Primary Examiner*—Matthew Smith
*Assistant Examiner*—Calvin Lee
(74) *Attorney, Agent, or Firm*—Skjerven Morrill MacPherson LLP; Don C. Lawrence

(57) ABSTRACT

A method for forming a titanium silicide on a silicon wafer. The method includes the steps of removing native oxide film formed on the silicon wafer; depositing a titanium thin film on the silicon wafer using standard type (low power) sputtering method; quickly heat-treating the silicon wafer on which the titanium thin film is deposited so that diffusion occurs between the titanium thin film and the silicon wafer, thereby forming the titanium silicide, and removing the titanium thin film. A degas process before the titanium deposition is proposed also to remove impurities on the wafer.

16 Claims, 3 Drawing Sheets

METHOD OF FORMING TITANIUM SILICIDE

BACKGROUND OF THE INVENTION (a) Field of the Invention

The present invention relates to a method for forming a titanium silicide during a process for fabricating a semiconductor device.

(b) Description of the Related Art

Silicide is widely used in manufacturing integrated circuit or semiconductor devices because of its low sheet resistance. Generally, in the case of titanium silicide, the silicide is formed by first depositing a titanium thin film using a sputtering process on a silicon wafer where source/drain regions and gate electrodes are formed. The silicon wafer is then heat-treated within an electric furnace or through RTP (rapid thermal processing) to cause the deposited titanium to react with the silicon wafer to form titanium silicide. The sheet resistance of the titanium silicide depends on the titanium thin film depositing conditions rather than the silicide forming heat-treating conditions.

The titanium thin film is usually deposited using the collimate (high power) sputtering method. In this method, metal atoms sputtered from a metal target pass through and are accelerated by a mesh disposed between the metal target and the silicon wafer. This causes the sputtered metal atoms to gain very high kinetic energy which can provide certain process advantages. However, use of the collimate sputtering method causes the metal atoms to be deposited onto the silicon wafer in a vertical direction with respect to the wafer surface. The deposition of the metal atoms in the vertical direction, in turn, causes the deposited titanium thin film to lack uniform film thickness. As a result, the resulting silicide thickness and sheet resistance have poor uniformity.

SUMMARY OF THE INVENTION

The present invention has been made in an effort to solve the above-described problems.

In accordance with the present invention, a method for forming a metal silicide, e.g. titanium silicide, with uniform thickness, low sheet resistance and uniform sheet resistance is provided.

In one embodiment, a titanium silicide is formed on a silicon wafer using the standard (low power) sputtering method (i.e. without causing the metal atoms to have a high kinetic energy as in the collimate sputtering method). The standard sputtering method, commonly used for aluminum metal deposition, generates metal atoms with low kinetic energy from a metal target for deposition on a wafer in random directions, thus providing uniform titanium thin film thickness.

However, one difficulty with depositing the titanium thin film through the standard sputtering method is that, because of the metal atoms' low kinetic energy, the metal atoms cannot readily penetrate the thin native oxide film which naturally exists on the exposed silicon wafer surfaces, e.g. on the surfaces of source/drain regions. (The native oxide film forms as a result of oxidation of the exposed silicon, e.g. from interactions between the exposed silicon and atmospheric oxygen.) Accordingly, the native oxide film functions as a diffusion barrier and interrupts the diffusion between the silicon and the titanium thin film, i.e. inhibits the formation of titanium silicide. This is not a problem in the collimate sputtering method wherein the metal atoms possess high kinetic energy and thus penetrate the native oxide film.

Thus, in accordance with the present invention, the native oxide film is removed, e.g. with a hydrofluoric (HF) acid etch, followed by a degas process to remove impurities, prior to deposition of the titanium thin film. As an example, the degas process is done in a degas chamber with halogen lamp type of heater. The degas process is performed at a relatively low degas temperature, e.g. 100 to 200° C., in contrast to what is commonly prescribed for degas processes. A relatively low degas temperature is used since high degas temperatures can undesirably create a thermal oxide film on the exposed silicon resulting in increased sheet resistance of the titanium silicide for reasons similar to those discussed above in relation to the native oxide film.

In an alternative embodiment, the degas process is not performed after the native oxide film is removed.

In either embodiment, after the native oxide film is removed (and any degas process performed), a titanium thin film is deposited using the standard type sputtering method.

In one embodiment, the titanium thin film is deposited on a silicon wafer which is in thermal equilibrium with a heater block that is set at a temperature of about 200° C. In accordance with this embodiment, the silicon wafer is brought into thermal equilibrium with the heater block by using a conventional convection heating process with an argon gas flow rate of 15 sccm. Once thermal equilibrium between the heater block and silicon wafer is achieved, the titanium is sputtered under the following conditions:

an argon gas flow rate of 25 sccm;

a direct current power of 2 KW; and a sputtering time of about 23 seconds.

Illustratively, the thickness of the titanium thin film deposited is about 480 Å.

After the titanium thin film is deposited, the silicon wafer is subjected to a rapid thermal process so that diffusion occurs between the titanium thin film and the silicon wafer, thereby forming the titanium silicide. After the rapid thermal process and accompanying formation of titanium silicide, the remaining titanium is removed.

Since a standard sputtering process is used, the resulting titanium silicide in accordance with the present invention has good thickness uniformity and sheet resistance. This is in contrast to the collimate sputtering method where the thickness and sheet resistance of the resulting silicide lacks uniformity as described above.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION

This application is substantially similar to Korean Patent Application No. 97-62316 filed on Nov. 24, 1997, the disclosure of which is incorporated herein by reference.

Various embodiments of the present invention will now be described in detail with reference to the accompanying drawings.

Figure 1A:
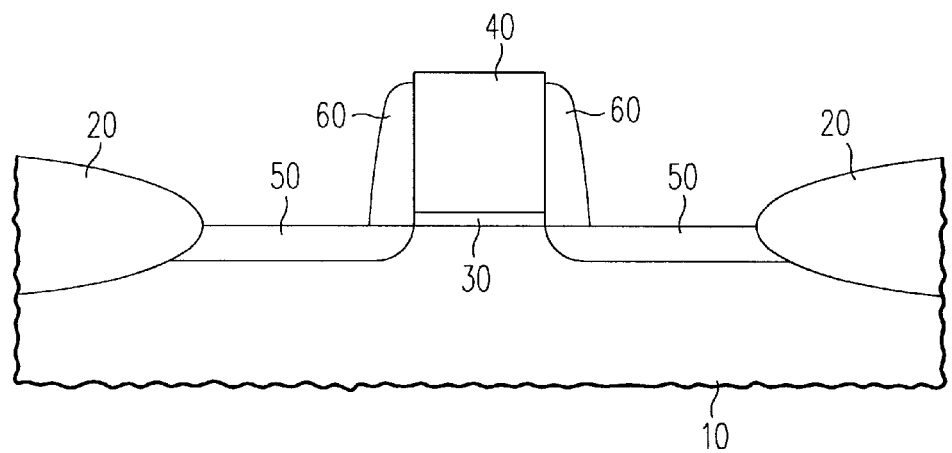
FIGS. 1a to 1d illustrate, in cross-section, a portion of a semiconductor device as it undergoes sequential processing steps for forming a titanium silicide in accordance with the present invention.

FIGS. 1a to 1d show a portion of a semiconductor device as it undergoes sequential processing steps for forming a titanium silicide in accordance with the present invention. Particularly, FIG. 1a shows a cross-sectional view of a silicon wafer 10 that has had any native oxide film removed, e.g. after a HF acid etch. A transistor pattern on which a silicide is to be formed comprises field oxides 20 for isolating different transistors, a gate oxide 30, a polysilicon gate layer 40 deposited on the gate oxide 30, source/drain regions 50, and spacers 60 configured on side walls of the gate oxide 30 and the polysilicon gate layer 40.

Figure 2:
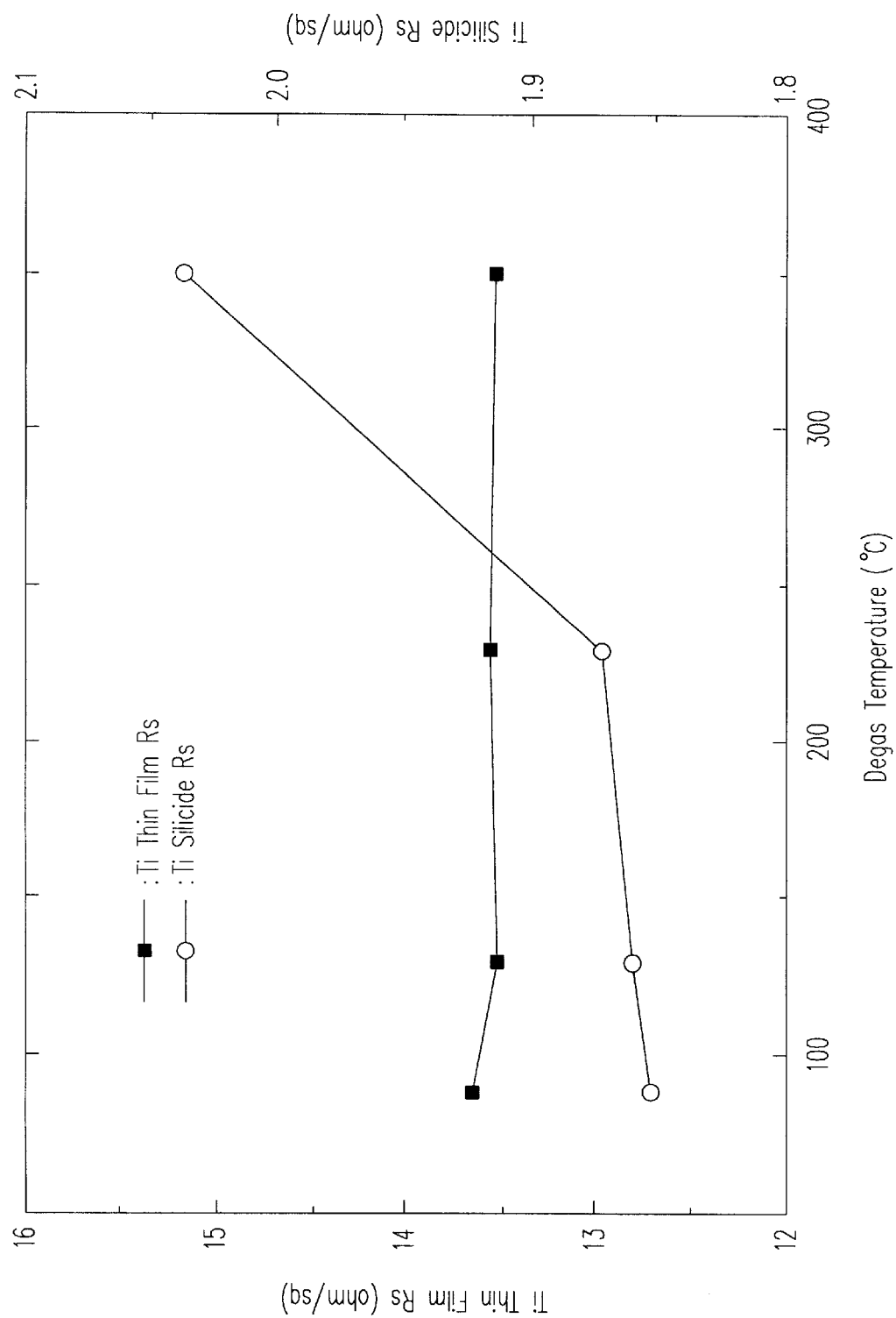
FIG. 2 is a graph illustrating variations in sheet resistance of titanium and titanium silicide films, in accordance with a variation in degas temperature applied during a degas process in accordance with the present invention.

After the native oxide film is removed as shown in FIG. 1a, optionally, a degas process can be performed to remove impurities from the wafer before the titanium thin film is deposited. The degas process is discussed in relation to FIG. 2. In FIG. 2, the respective sheet resistances of a thin film of titanium deposited on a silicon wafer, and a film of titanium silicide resulting from a rapid thermal processing thereof, are respectively plotted on the left-hand and right-hand ordinates of a graph as a function of the degas temperature, i.e., the temperature to which the wafer is heated during the degas process, which is plotted on the abscissa of the graph.

In FIG. 2, the left vertical axis indicates sheet resistance (Ω/sq) of the deposited titanium thin film, the right axis denotes sheet resistance (Ω/sq) of the titanium silicide resulting from the reaction of the deposited titanium and silicon, and the horizontal axis indicates degas temperature (°C). In one embodiment, the degas temperature is controlled by the power provided to a halogen lamp inside a degas chamber.

As shown in FIG. 2, the sheet resistance of the deposited titanium thin film is minimally affected by the degas temperature. However, the sheet resistance of the titanium silicide is greatly affected by the degas temperature. In particular, the higher the degas temperature, the higher the sheet resistance of the titanium silicide. This is because the higher degas temperature creates a thermal oxide film on the exposed silicon surfaces of the wafer. This thermal oxide film inhibits diffusion between the silicon of the wafer and the deposited titanium thin film and, accordingly, the sheet resistance of the resulting titanium silicide increases. Therefore, to reduce the sheet resistance of the titanium silicide, the thickness of the thermal oxide film should be reduced to as thin as possible by using a low degas temperature. Illustratively, the degas is performed at a subatmospheric pressure (a low level vacuum) with a degas temperature in the range of 100 to 200° C. In one embodiment, a degas temperature of 130° C. and a degas time of 50 seconds is used.

Alternatively, a high degas temperature (e.g. greater than 200° C., and in one embodiment greater than 230° C.) is used during the degas process and the resulting thermal oxide film is removed (e.g. with a HF acid etch) before the titanium thin film is deposited.

As another alternative scheme for reducing the sheet resistance of the resulting titanium silicide, the degas process may be omitted. As shown in FIG. 2, the sheet resistance of the titanium silicide is low when the degas process is omitted. However, it is desirable to perform the degas process since it also serves the important function of removing impurities on the surface of the wafer to avoid transistor performance degradations.

Figure 1B:
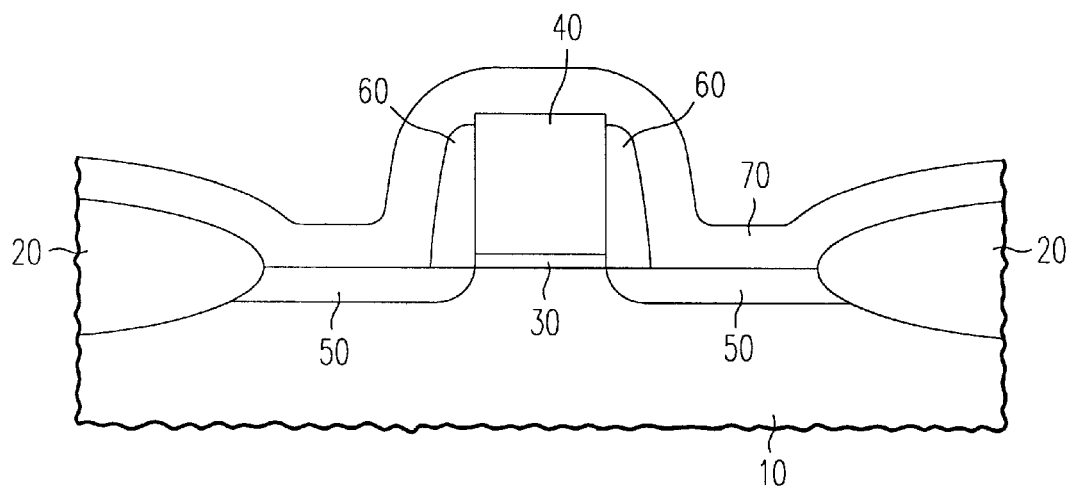

Regardless of whether the degas process is performed at low temperature, or at high temperature with subsequent thermal oxide removal, or not performed at all, as shown in FIG. 1b, a titanium thin film 70 is deposited on the silicon wafer 10 through the standard type sputtering method.

In one embodiment, the titanium thin film is deposited on a silicon wafer which is in thermal equilibrium with a heater block that is set at a temperature of about 200° C. In accordance with this embodiment, the silicon wafer is brought into thermal equilibrium with the heater block by using a conventional convection heating process with an argon gas flow rate of 15 sccm. Once thermal equilibrium between the heater block and silicon wafer is achieved, the titanium is sputtered under the following conditions:

an argon gas flow rate of 25 sccm;

a direct current power of 2 KW; and a sputtering time of about 23 seconds.

Illustratively, the thickness of the titanium thin film deposited is about 480 Å.

Figure 1C:
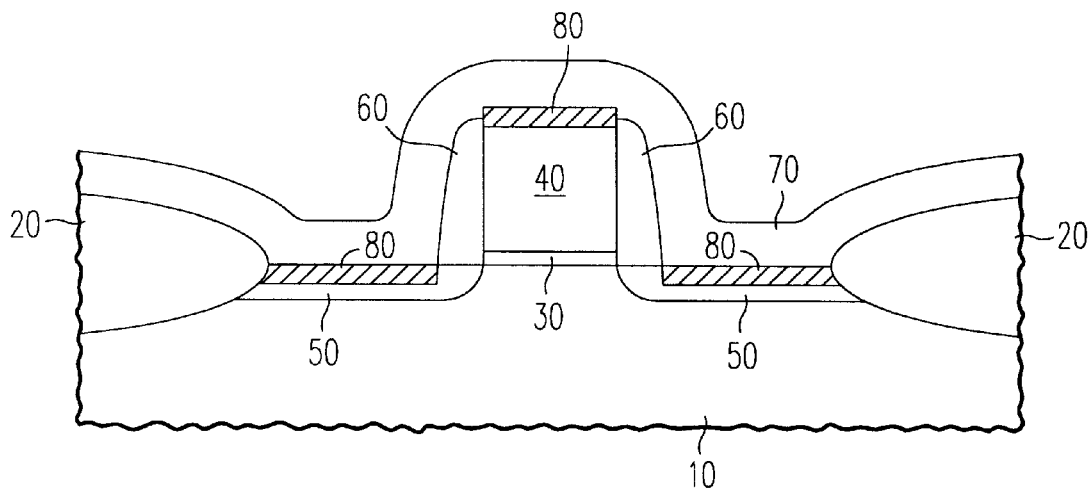

Next, as shown in FIG. 1c, by heating the silicon wafer 10 using a rapid thermal process, a titanium silicide pattern 80 is formed between the silicon wafer 10 and the titanium thin film 70 and between the polysilicon gate layer 40 and the titanium thin film 70, i.e. on the upper surfaces of the source/drain regions 50 and the upper surface of the polysilicon gate layer 40 which contact the titanium thin film 70. The rapid thermal process is performed by directing at the silicon wafer 10 a nitrogen gas flow of 5 slm for 30 seconds at a pressure of about 780 torr and at a temperature of approximately 750° C.

Figure 1D:
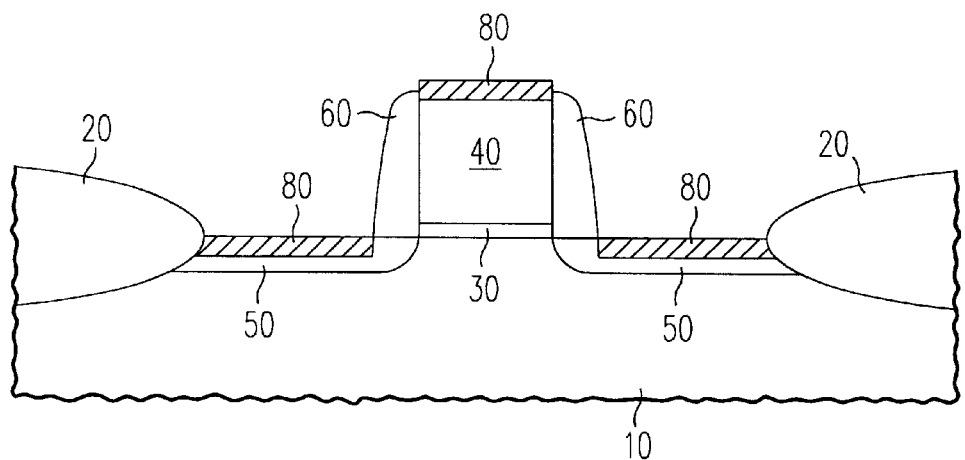

Following the formation of the titanium silicide pattern 80, as shown in FIG. 1d, the remaining titanium thin film 70 is removed through a conventional strip process. Then the silicon wafer 10 is further heat-treated to stabilize the phase of the titanium silicide pattern 80 formed.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method for forming titanium silicide on a silicon wafer, the method comprising:

removing a native oxide film formed on the silicon wafer;

conducting a degas process by heating the silicon wafer at a low temperature in a degas chamber;

sputtering a titanium thin film having a uniform thickness on the silicon wafer using a low-power, direct-current sputtering method that generates titanium atoms having a low kinetic energy and moving in random directions;

rapid thermal processing the silicon wafer on which the titanium thin film is deposited so that diffusion occurs between the titanium thin film and the silicon wafer, thereby forming the titanium silicide; and removing the titanium thin film.

2. The method of claim 1 wherein the step of sputtering is conducted under the following conditions:

an argon gas flow rate of 25 sccm;

a direct current power of 2 KW; and a sputtering time of about 23 seconds.

3. The method of claim 2 wherein a thickness of the titanium thin film deposited during the step of sputtering is about 480 Å.

4. The method of claim 1 wherein the low temperature is in the range of 100 to 200° C.

5. The method of claims 4 wherein the low temperature is approximately 130° C.

6. A method, comprising:

providing a semiconductor wafer having a silicon region with a native oxide layer formed thereon;

removing the native oxide layer;

degassing the semiconductor wafer by heating the wafer to a temperature in the range of 100 to 200° C.;

depositing a thin, uniform thickness of a silicide forming metal on the silicon region using a low-power, direct-current sputtering method that generates atoms of the metal having a low kinetic energy and moving in random directions; and causing the silicide forming metal to react with silicon of the silicon region to form metal silicide on the silicon region.

7. The method of claim 6 wherein the silicide forming metal is titanium.

8. The method of claim 6 wherein the silicon region is a source/drain region of a semiconductor device.

9. The method of claim 6 wherein the native oxide layer is removed with a hydrofluoric acid etch.

10. The method of claim 6 wherein the step of degassing is performed by heating the semiconductor wafer to approximately 130° C.

11. The method of claim 6 wherein the step of depositing a silicide forming metal comprises the step of heating the semiconductor wafer.

12. The method of claim 11 wherein the step of heating the semiconductor wafer comprises bringing the semiconductor wafer into thermal equilibrium with a heater block that is set at a temperature of about 200° C.

13. The method of claim 6 wherein the step of causing the silicide forming metal to react with silicon of the silicon region comprises the step heating the semiconductor wafer.

14. The method of claim 13 wherein the step of heating the semiconductor wafer comprises the step of directing heated gas at the semiconductor wafer.

15. The method of claim 6 further comprising the step of removing the silicide forming metal.

16. A method, comprising:

providing a semiconductor wafer having a silicon region with a native oxide layer formed thereon;

removing the native oxide layer;

degassing the semiconductor wafer by heating the wafer to a temperature greater than 200° C.;

removing any thermal oxide film formed on the silicon region depositing a thin, uniform thickness of a silicide-forming metal on the silicon region using a low-power, direct-current sputtering method that generates atoms of the metal having a low kinetic energy and moving in random directions; and causing the silicide forming metal to react with silicon of the silicon region to form metal silicide on the silicon region.

* * * * *